United States Patent
Jeon

(10) Patent No.: US 11,437,119 B2
(45) Date of Patent: Sep. 6, 2022

(54) ERROR READ FLOW COMPONENT

(71) Applicant: Micron Technology, Inc., Boise, ID (US)

(72) Inventor: Seungjune Jeon, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 98 days.

(21) Appl. No.: 16/997,500

(22) Filed: Aug. 19, 2020

(65) Prior Publication Data

US 2022/0058087 A1    Feb. 24, 2022

(51) Int. Cl.
| G06F 11/14 | (2006.01) |
| G11C 29/00 | (2006.01) |
| G11C 29/52 | (2006.01) |
| G11C 16/34 | (2006.01) |
| G06F 11/10 | (2006.01) |

(52) U.S. Cl.
CPC ........ *G11C 29/765* (2013.01); *G06F 11/1076* (2013.01); *G06F 11/1402* (2013.01); *G11C 16/3404* (2013.01); *G11C 29/52* (2013.01); *G06F 2201/85* (2013.01)

(58) Field of Classification Search
CPC ... G11C 29/765; G11C 16/3404; G11C 29/52; G06F 11/1076; G06F 11/1402; G06F 2201/85
See application file for complete search history.

(56) References Cited

U.S. PATENT DOCUMENTS

| 6,317,850 | B1 * | 11/2001 | Rothberg | G06F 11/008 714/704 |
| 9,886,341 | B2 | 2/2018 | Das | |
| 10,282,252 | B2 | 5/2019 | Park | |
| 10,741,232 | B1 * | 8/2020 | Jabeur | G11C 11/1673 |
| 2006/0271809 | A1 * | 11/2006 | Ichikawa | G06F 11/0727 714/2 |
| 2009/0172335 | A1 | 7/2009 | Kulkarni et al. | |
| 2010/0106906 | A1 | 4/2010 | Galloway et al. | |
| 2010/0235713 | A1 * | 9/2010 | Lee | G06F 11/1072 714/763 |
| 2014/0160845 | A1 * | 6/2014 | Ratnam | G11C 16/26 365/185.09 |
| 2015/0378815 | A1 | 12/2015 | Goda et al. | |
| 2016/0049203 | A1 | 2/2016 | Alrod et al. | |
| 2017/0308438 | A1 * | 10/2017 | Yim | G11C 16/3418 |
| 2020/0159602 | A1 * | 5/2020 | Oh | G11C 13/0004 |

* cited by examiner

*Primary Examiner* — Kyle Vallecillo
(74) *Attorney, Agent, or Firm* — Brooks, Cameron & Huebsch, PLLC

(57) ABSTRACT

An apparatus includes an error read flow component resident on a memory sub-system. The error read flow component can cause performance of a plurality of read recovery operations on a group of memory cells that are programmed or read together, or both. The error read flow component can determine whether a particular read recovery operation invoking the group of memory cells was successful. The error read flow component can further cause a counter corresponding to each of the plurality of read recovery operations to be incremented in response to a determination that the particular read recovery operation invoking the group of memory cells was successful.

19 Claims, 5 Drawing Sheets

ERROR READ FLOW COMPONENT

TECHNICAL FIELD

Embodiments of the disclosure relate generally to memory sub-systems, and more specifically, relate to an error read flow component.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
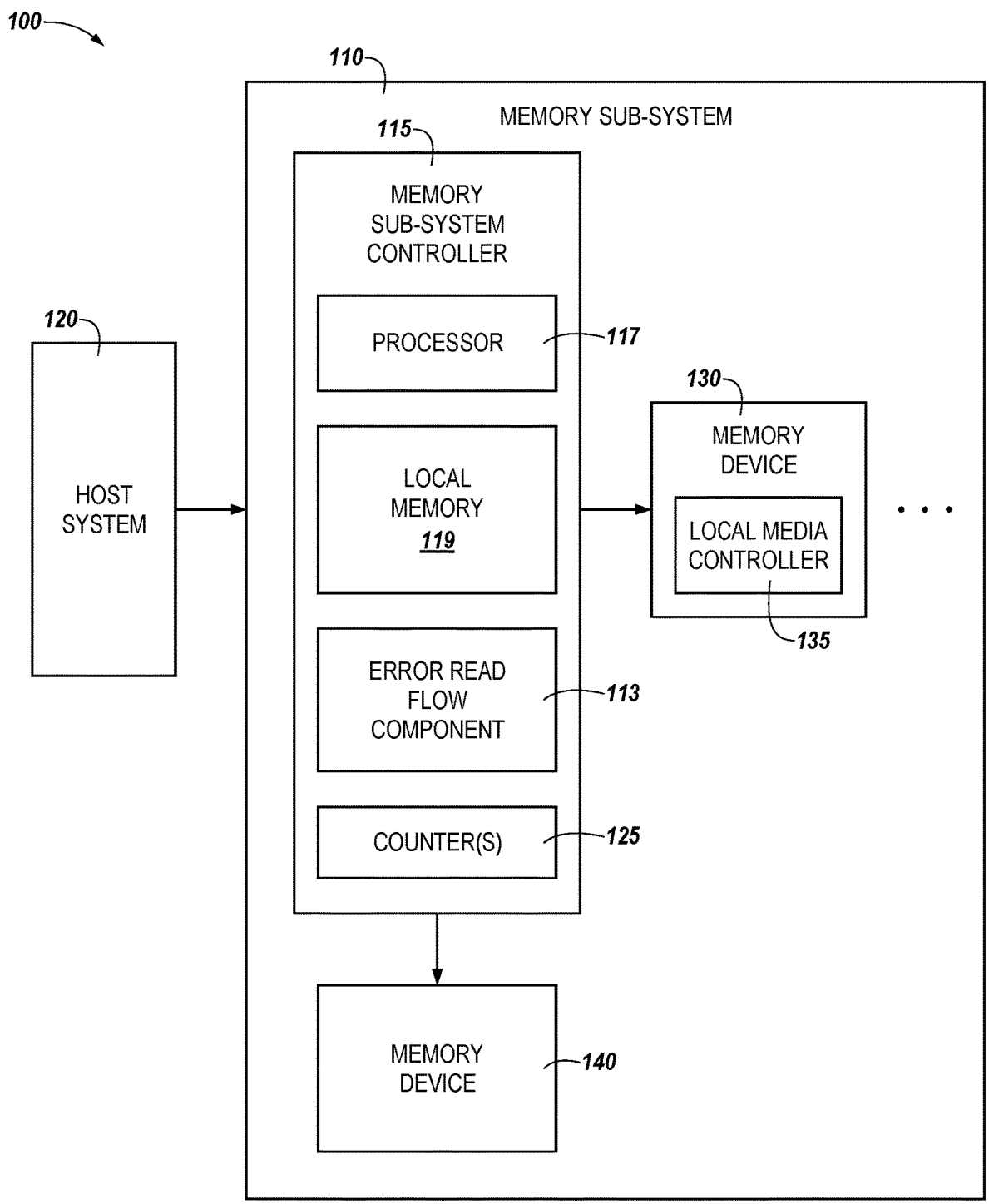
FIG. 1 illustrates an example computing environment that includes a memory sub-system in accordance with some embodiments of the present disclosure.

Aspects of the present disclosure are directed to memory sub-systems that include an error read flow component, in particular to memory sub-systems that include counters within a memory device that are incrementable based on completing a read recovery operation. A memory sub-system can be a storage system, storage device, a memory module, or a combination of such. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

A memory device can be a non-volatile memory device. One example of a non-volatile memory device is a three-dimensional cross-point memory device that includes a cross-point array of non-volatile memory cells. Other examples of non-volatile memory devices are described below in conjunction with FIG. 1. A memory operation (e.g., a read, write, or other memory operation) can be initiated to read from and/or write data to storage locations (e.g., memory cells) within the memory device. Memory sub-systems (e.g., SSDs) can include various control circuitry, which can employ a memory management operation such as an error detection and/or read recovery technique.

In some conventional approaches, a component of a memory sub-system can perform read recovery operations and attempt to determine whether a read recovery process was successful. For example, some memory sub-systems can check read recovery processes and attempt to determine a quantity of successful read recovery operations. Some approaches can attempt to determine if a debug operation could be executed for determined unsuccessful read recovery operations.

Aspects of the present disclosure address the above and other deficiencies by providing an error read flow component that can be resident on a memory sub-system and configured to cause performance of read recovery operations on a managed unit of memory. As used herein, the term "resident on" refers to something that is physically located on a particular component. For example, the error read flow component being "resident on" the memory sub-system refers to a condition in which the error read flow component is physically coupled to, or physically within, the memory sub-system. The term "resident on" may be used interchangeably with other terms such as "deployed on" or "located on," herein.

In some embodiments, the error read flow component can determine whether a particular read recovery operation invoking the managed unit was successful. The error read component may then cause a counter corresponding to each of the read recovery operations to be incremented in response to a determination that the particular read recovery operation invoking the managed unit was successful. There can be multiple counters that can be used for each stage of the read recovery operation such that each counter is incremented responsive to the success of the read recovery operation on the managed unit in that stage.

As used herein, a "managed unit" (MU) generally refers to a number of memory cells that are programmed and/or read together or as a functional group. A managed unit can correspond to a logical block size (e.g., a data transfer size of a host and/or a data management size of a memory system), which can be, for example, 4 KB. As an example, a managed unit can be mapped to a physical block of memory cells. However, embodiments are not so limited. For example, a managed unit may correspond to more than a logical block size when a group of memory cells storing user data and overhead data (e.g., data informative of other data stored within the group of memory cells) corresponds to more than a logical block size. As an example, the overhead data can include data such as metadata, error correction code (ECC) data, logical block addresses (LBA) data as well as counters (e.g., read/write counters) associated with memory operations performed on a managed unit. In some embodiments, a MU can include multiple codewords. As used herein, a "codeword" generally refers to a collection of data (e.g., a data block) that can be protected by an ECC. Accordingly, an element of an error correcting code can be associated with one or more codewords. A codeword can, in some embodiments, be an independently encoded data block that corresponds to an error detection code such as a cyclic redundancy check (CRC).

Read failures occur when accessed data bits (e.g., memory cells representing information retrieved by a processor) have incorrect states. Reducing read failures increases the operational reliability of memory sub-systems. As the size and quantity of data stored by a memory sub-system increases, the quantity of erroneous bits in data (e.g., a managed unit, a group of cells, a block, or sector of the memory sub-system) stored by the memory sub-system can increase as well. As the number of erroneous bits increases, more time and/or processing resources can be consumed in detecting and correcting the erroneous bits. For example, in some approaches, doubling the number of erroneous bits can approximately double the amount of time needed to decode the data and extract the correct data. Further, in some approaches, doubling the number of erroneous bits can increase the amount of processing resources used in decoding the data to extract the correct data.

In addition, as the data is corrected and goes through a read recovery process, recognizing the exact stage that was successful in correcting errors can be difficult to ascertain. It may also be difficult to determine how many read recovery operations were successful at each stage of a read recovery process. The difficulty in specifically identifying successful stages of read recovery operations (e.g., read recovery flows) and where such successful operations occur can make it difficult to determine how to efficiently perform debugging operations in a memory sub-system. As used herein, a "debug operation" refers to an operation to execute a set of software instructions to reset, eliminate, and/or reduce errors (e.g., erroneous data and/or codewords) stored within the memory sub-system.

In embodiments described herein, a memory sub-system can include an error read flow component, which can be used to specifically identify how many read recovery cases were successfully performed at each stage in a read recovery process and determine whether a debugging operation could be carried out. As described in more detail, herein, utilization of the error read flow component can address deficiencies inherent in approaches that rely solely on application of discrete read voltages to particular memory cells or pages of memory cells instead of grouping the read recovery process by managed units (MUs).

For example, as described in more detail herein, an error read flow component can perform data recovery operations on data (e.g., codewords) that contain bit errors, such as bit flip errors, uncorrectable errors, etc. to recover data that can be otherwise unrecoverable in some approaches. In some embodiments, the data can be part of a managed unit (MU) provided to the error read flow component on which read recovery operations will be performed. The error read flow component can determine whether the read recovery operation was performed successful and specifically identify at what stage in the recovery the correction is performed and how many errors were corrected at each stage in the process. Examples of read recovery operations that can be facilitated by an error read flow component and can include redundant array of independent disk (RAID) recovery and/or recovery using different discrete read voltages (e.g., VDM retry recovery), among other recovery operations. As used herein, a "discrete read voltage" or "VDM" generally refers to a demarcation voltage which can be applied across the terminals of a memory cell when sensing the state of a memory cell. The state of the memory cell may be sensed based on the reaction of the memory cell to the applied discrete read voltage. For example, the memory cell may either go into a conductive ON state (logic one) or remain in a weakly conductive OFF state (logic zero). The applied voltage at which a memory cell transitions from being sensed as a logic one to being sensed as a logic zero could be termed a threshold voltage of the memory cell. Thus, as an example, when the VDM is higher than the threshold voltage of the memory cell, the memory cell could be sensed as storing a logic one and when the VDM is lower than the threshold voltage of the memory cell, the memory cell may be sensed as storing a logic zero.

In some embodiments, the error read flow component can perform read recovery operations by performing a first read using a first discrete read voltage (VDM1). If the data cannot be read, a first RAID recovery operation can be applied to a codeword containing an error to correct a threshold quantity of errors within the codeword to attempt to recover the data. The first RAID recovery operation can be followed by a second read using VDM1. In some embodiments, a second RAID recovery operation can be executed followed by a second read using VDM1. If the error is still not corrected, a first read can be performed using a second VDM (VDM2). The first read using VDM2 can be the third read in the recovery operation. If the data still contains errors and therefore cannot be read, a third RAID recovery operation can be executed to attempt to correct errors within the data. The third RAID recovery operation can be followed by a second read using VDM2. The second read using VDM2 may be the fourth read in the recovery operation. A fourth RAID recovery operation can be executed next followed by a third read using VDM2. The third read using VDM2 may be the fifth read in the recovery operation. If the error is still not corrected, a first read operation can be performed using a third VDM (VDM3). The first read using VDM3 may be the fifth read in the recovery operation. If the data cannot be read using the third VDM, a fifth RAID recovery operation can be executed to correct any errors within the data. The fifth RAID recovery operation can be followed by a second read using VDM3.

In some embodiments, the recovery count at each stage can be obtained by determining a difference between a value corresponding to the counter at a particular stage and a value of the counter at the next stage. That is, the recovery count at each stage can be determined by subtracting the number of MUs successfully incremented on a counter at a current level minus the number of MUs successfully incremented on a counter at the next stage. For example, subtracting the number of MUs that a second RAID recovery operation was executed on from the number of MUs that were read prior to the second RAID recovery operation can be indicative of the recovery count for a given recovery stage.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, the memory sub-system controller 115 includes at least a portion of the error read flow component 113. For example, the memory sub-system controller 115 can include a processor 117 (processing device) configured to execute instructions stored in local memory 119 for performing the operations described herein. In some embodiments, the error read flow component 113 is part of the host system 110, an application, or an operating system.

In some embodiments, the memory devices 130 include local media controllers 135 that operate in conjunction with memory sub-system controller 115 to execute operations on one or more memory cells of the memory devices 130.

The memory sub-system 110 includes an error read flow component 113 that can be configured to execute read data recovery based on managed units (MUs), determine which process of the read data recovery was successful, increment a counter 125 when a process of the read data recovery is successful and determine if a debug operation may be executed for unsuccessful read data recovery. Although not shown in FIG. 1 so as to not obfuscate the drawings, the error read flow component 113 can include various circuitry to facilitate read data recovery on the codewords and/or MUs. For example, the error read flow component 113 can include special purpose circuitry in the form of an ASIC, FPGA, state machine, and/or other logic circuitry that can allow the error read flow component 113 to provide read data recovery to codewords of a MU that include bit flip errors and/or uncorrectable errors after error correction operations have been performed on the codewords and/or MU.

In some embodiments, a MU can comprise host data, an error correction code parity, a RAID parity, a cyclic redundancy check code (CRC), and/or meta data. The host data can include up to 4096 bytes, although embodiments are not limited to this particular enumerated value. In some embodiments, the managed unit can include sixteen (16) codewords and multiple managed units can be processed in parallel such that thirty-two (32) or greater codewords can be processed in parallel using the error read flow component 113. An exclusive-or (XOR) operation of the 16 codewords will produce a sum of zero (0) responsive to the errors in the codewords being eliminated.

In a non-limiting example, a managed unit can include fifteen (15) codewords and one RAID codeword, however embodiments are not limited to a specific quantity of codewords per managed unit. The codewords can include up to 160 bytes. As such, a MU can include up to 5120 bytes. A RAID strip can include sixteen (16) codewords. One MU can comprise two (2) RAID stripes. However, in such embodiments, a MU may not process more than 2 RAID stripes.

The error read flow component 113 endeavors to group read recovery operations based on MUs not RAID strips. Managing read recovery based on MUs can allow for more detailed insight into read recovery operations such as the level at which the correction is successfully applied, the number of successful corrections at each level, and where a debug operation may be applied in contrast to approaches that do not manage read recovery based on MUs.

The memory sub-system controller 115 can further include counter(s) 125. The counter(s) 125 can include one or more storage locations (e.g., latches, flip-flops, registers, caches, or the like) that can store one or more data values. In some embodiments, the data values can correspond to a quantity of successful read recovery operations performed at one or more stages of an error recovery flow process. Although shown as a distinct component from the error read flow component 113, in some embodiments, the counter(s) 125 can be partially or entirely deployed within the error read flow component 113. Accordingly, in some embodiments, a unique counter among multiple counter(s) 125 can be assigned to store an indication of a quantity of successful read recovery operations for each stage of a read recovery flow process. Embodiments are not so limited, however, and in some embodiments, the counter(s) 125 can be a single contiguous register that can be portioned into multiple sections that can each be used to store an indication of a quantity of successful read recovery operations for each stage of a read recovery flow process.

Figure 2:
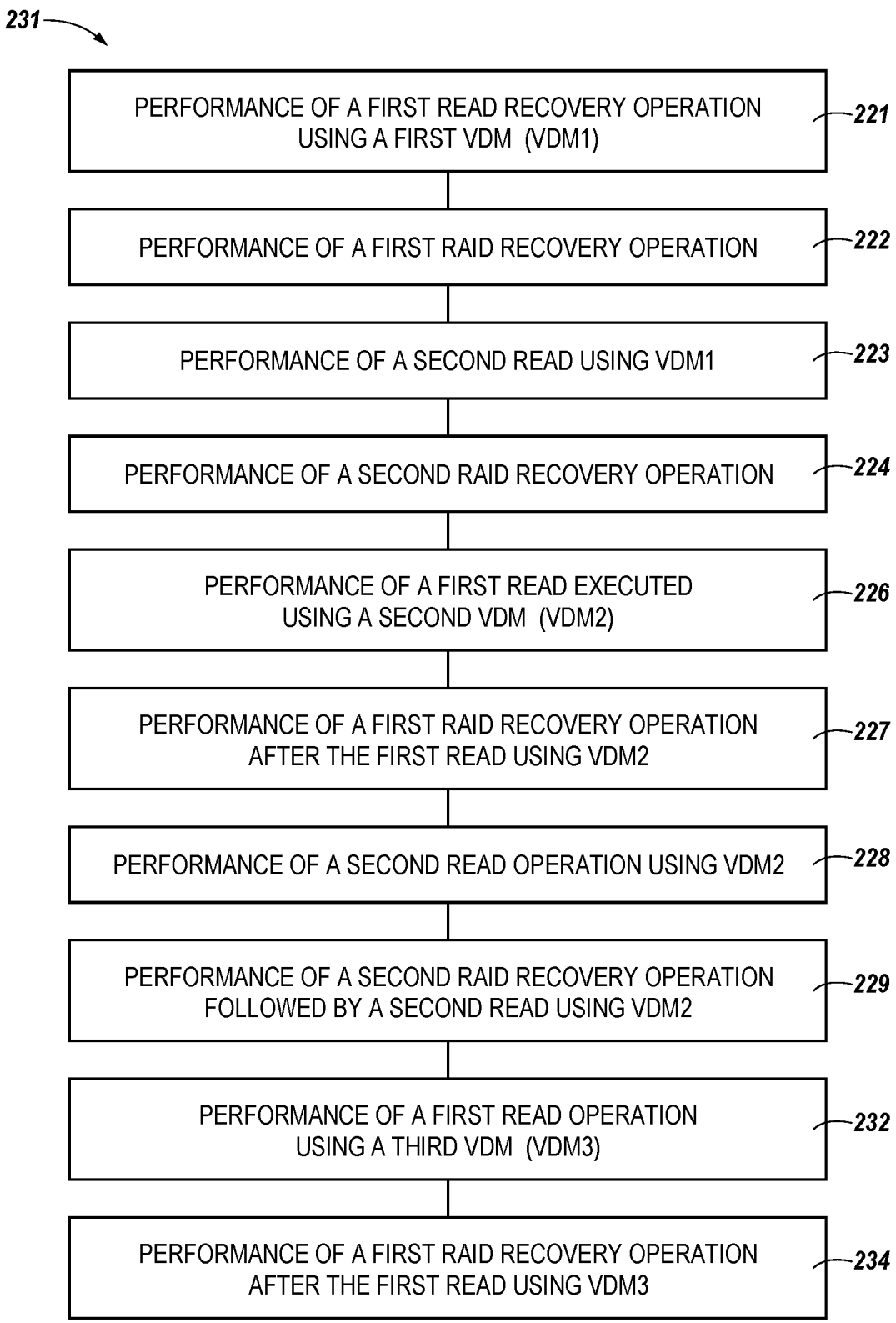
FIG. 2 is a flow diagram of an example process executed by an error read flow component in accordance with some embodiments of the present disclosure.

FIG. 2 is a flow diagram 231 of an example process executed by an error read flow component in accordance with some embodiments of the present disclosure. The process can be performed by an error read flow component, such as the error read flow component 113 illustrated in FIG. 1.

In some embodiments, the error read flow component can perform nine (9) read recovery stages which can include four (4) read operations and five (5) redundant array of independent disk (RAID) recovery operations. An attempt to recover a MU can be performed at each of these 9 stages. A counter, such as counter 125 illustrated in FIG. 1, can be incremented at each recovery stage and a success rate of each stage is ascertained by subtracting the number of MUs successfully incremented on a counter at a current level minus the number of MUs successfully incremented on a counter at the next stage.

Operation 221 of the example flow 231 can include performance of a first read recovery operation using a first VDM (VDM1). Examples of read recovery operations that can be facilitated by an error read flow component can include using different discrete read voltages (e.g., VDM retry recovery). The first VDM can be applied across the terminals of a memory cell when sensing the state of a memory cell. The state of the memory cell may be sensed based on the reaction of the memory cell to the applied discrete read voltage. For example, the memory cell can either go into a conductive ON state (logic one) or remain in a weakly conductive OFF state (logic zero). The applied voltage at which a memory cell transitions from being sensed as a logic one to being sensed as a logic zero can be termed a threshold voltage of the memory cell. Thus, as an example, when the VDM is higher than the threshold voltage of the memory cell, the memory cell can be sensed as storing a logic one and when the VDM is lower than the threshold voltage of the memory cell, the memory cell can be sensed as storing a logic zero. A counter can be incremented for each MU that is successfully read during the first read using VDM1. Although described herein as a single counter, embodiments are not so limited and multiple counters, registers, caches, or the like can be provided to a memory sub-system to facilitate tracking of quantities of successful read recovery operations for one or more stages of the read recovery operations described herein. Further, in some embodiments, one or more counters, registers, caches, or the like can be split into multiple partitions in which the quantities of successful read recovery operations for various stages of a read recovery operation can be written and/or stored.

Operation 222 of the example flow 231 can include performance of a first RAID recovery operation. The RAID recovery operation is executed if there are MUs that cannot be read in the initial read operation. Examples of read recovery operations that can be facilitated by an error read flow component can include RAID recovery to correct any errors within the data. If the data cannot be read using the VDM1, a RAID recovery operation can be performed on the MU. A counter can be incremented for each MU that is successfully recovered during the first RAID recovery operation. The first RAID recovery operation can be followed by a second read using VDM1.

Operation 223 of the example flow 231 can include performance of a second read using VDM1. Each VDM can be applied twice to attempt recovery of the MU. A counter can be incremented for each MU that is successfully read during the second read using VDM1. Following a first RAID recovery operation, a second read can be attempted using VDM1 again to recover the MU.

Operation 224 of the example flow 231 can include performance of a second RAID recovery operation. If the data cannot be read during the second read with VDM1, a second RAID recovery operation can be performed on the MU. A counter can be incremented for each MU that is successfully recovered during the second RAID recovery operation. The second RAID recovery operation can be executed followed by a read using VDM1. The read can be executed to determine how many MUs were recovered during the RAID recovery operation.

Operation 226 of the example flow 231 can include performance of a first read executed using a second VDM (VDM2). The first read using VDM2 may be the third read in the recovery operation. If there are MUs that have not been recovered, a read operation can be performed using a different VDM (e.g., VDM2, etc.). In some embodiments, the codewords that contain the bit flip error can be re-read using a discrete read voltage greater than a discrete read voltage used to initially read the error corrected codewords. For example, the VDM used to read the codewords from a memory device can be incremented such that subsequent stages of read recovery are performed using a discrete read voltage or a threshold voltage that is greater than a discrete read voltage or threshold voltage used at a previous stage of the read recovery operation. A counter can be incremented for each MU that is successfully read during the first read using VDM2.

Operation 227 of the example flow 231 can include performance of a first RAID recovery operation after the first read using VDM2. The first RAID recovery operation after the first read using VDM2 may be the third RAID recovery operation in the flow 231. If there are MUs that are not recovered, a first RAID recovery operation can be executed to correct any errors within the data. A counter can be incremented for each MU that is successfully recovered during the first RAID recovery operation. The first RAID recovery operation can be followed by a read using VDM2. The read can be executed to determine how many MUs were recovered during the first RAID recovery operation.

Operation 228 of the example flow 231 can include performance of a second read operation using VDM2. The second read using VDM2 may be the fourth read in the recovery operation. A counter can be incremented for each MU that is successfully read during the second read using VDM2. If there are MUs that have not been recovered, a second read can be performed using VDM2.

Operation 229 of the example flow 231 can include performance of a second RAID recovery operation followed by a second read using VDM2. The second RAID recovery operation after the second read using VDM2 may be the fourth RAID recovery operation in the flow 231. The RAID recovery operation can be followed by a second read using VDM2. The read can be executed to determine how many MUs were recovered during the second RAID recovery operation. A counter can be incremented for each MU that is successfully recovered during the second RAID recovery operation.

Operation 232 of the example flow 231 can include performance of a first read operation using a third VDM (VDM3). The first read using VDM3 may be the fifth read in the recovery operation. If there are MUs that have not been recovered, a read can be performed using a different VDM. In some embodiments, the codewords that contain the bit flip error can be re-read using a discrete read voltage greater than a discrete read voltage used to initially read the error corrected codewords. For example, the VDM used to read the codewords from a memory device can be incremented such that subsequent stages of read recovery are performed using a discrete read voltage or a threshold voltage that is greater than a discrete read voltage or threshold voltage used at a previous stage of the read recovery operation. A counter can be incremented for each MU that is successfully read during the first read using VDM3.

Operation 234 of the example flow 231 can include performance of a first RAID recovery operation after the first read using VDM3. The first RAID recovery operation after the first read using VDM3 may be the fifth RAID recovery operation in the flow 231. If there are MUs that are not recovered, a first RAID recovery operation can be executed to correct any errors within the data. The first RAID recovery operation can be followed by a read using VDM3. The read can be executed to determine how many MUs were recovered during the RAID recovery operation. A counter can be incremented for each MU that is successfully recovered during the first RAID recovery operation. Embodiments are not so limited to the steps listed above and can include intervening steps.

In some embodiments, the error read flow component can be configured to determine that a quantity of codewords contains an uncorrectable error after stage 234 of flow 231. The quantity of codewords contains an uncorrectable error after stage 234 of flow 231 is deemed lost. A MU not recovering after stage 234 is an indication that there may be a bug within the data and a debug operation can be executed.

Figure 3:
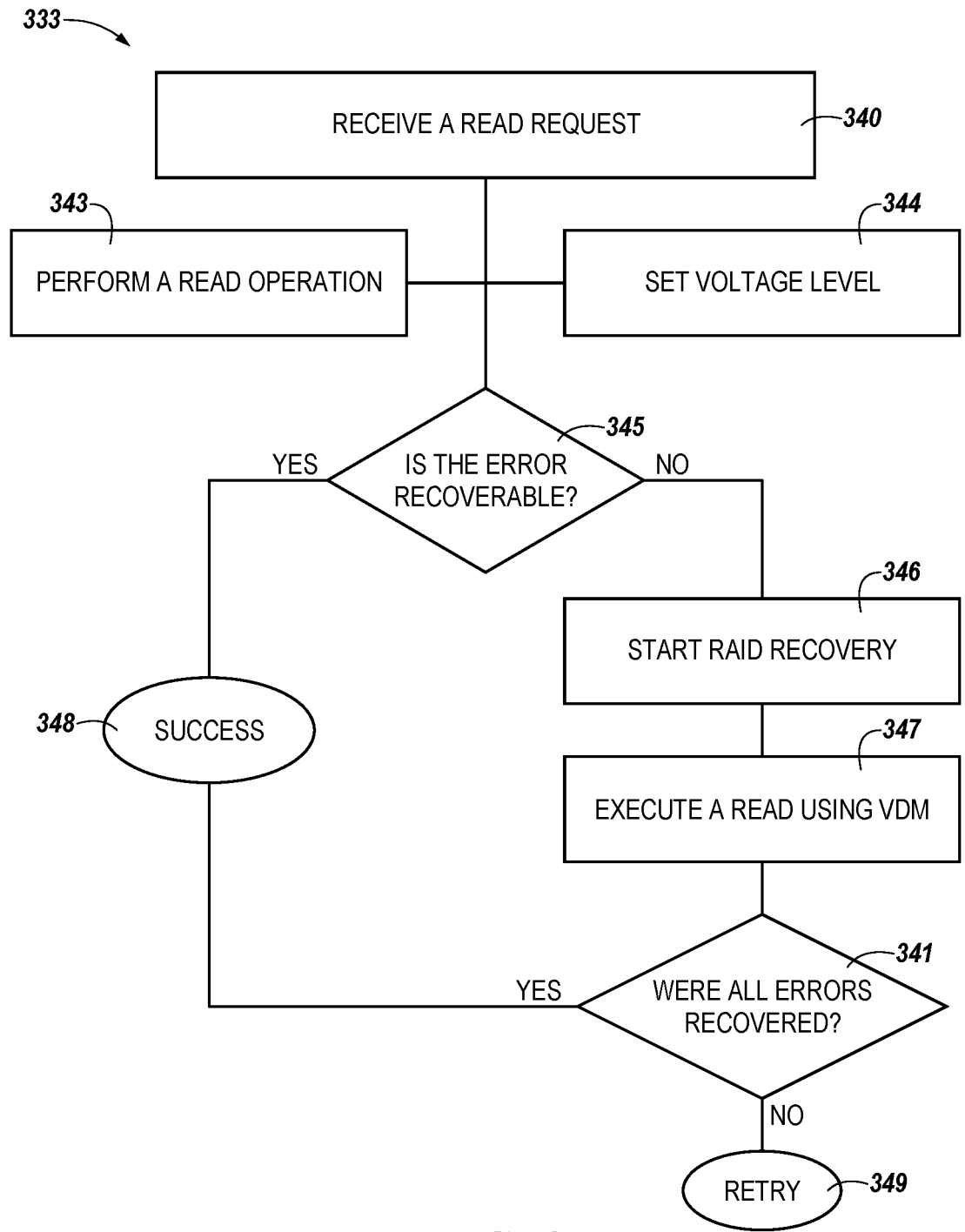
FIG. 3 is a flow diagram corresponding to an error read flow component in accordance with some embodiments of the present disclosure.

FIG. 3 is a flow diagram 333 corresponding to an error read flow component in accordance with some embodiments of the present disclosure. The error read flow component, e.g., the error read flow component 113 illustrated in FIG. 1, can perform operations to determine whether the read recovery operation was performed successfully and specifically identify at what stage in the recovery the correction is performed and how many errors were corrected at each stage in the process.

The stages of the flow diagram 333 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the process 333 is performed by the error read flow component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 340, the flow diagram 333 can include receiving a read request. The read request can be received by the error read flow component. The error read flow component can be resident on a memory sub-system and configured to cause performance of read recovery operations on a managed unit of memory. The read can be performed on codewords within a managed unit. A "managed unit" (MU) generally refers to a number of memory cells that are programmed and/or read together or as a functional group.

At operation 343, the flow diagram 333 can include performing a first read operation. The error read flow component can perform data recovery operations on data (e.g., codewords) that contain bit errors, such as bit flip errors, uncorrectable errors, etc. to recover data that can be otherwise unrecoverable in some approaches. In some embodiments, the data can be part of a managed unit (MU) provided to the error read flow component on which read recovery operations will be performed. The error read flow component can determine whether the read recovery operation was performed successful and specifically identify at what stage in the recovery the correction is performed and how many errors were corrected at each stage in the process.

At operation 344, the flow diagram 333 can include setting a VDM. The data within a MU can be read using different discrete read voltages (e.g., VDM retry recovery). That is, the first read operation can be executed using a VDM. The VDM can be applied across the terminals of a memory cell when sensing the state of a memory cell. The state of the memory cell can be sensed based on the reaction of the memory cell to the applied discrete read voltage. For example, the memory cell can either go into a conductive ON state (logic one) or remain in a weakly conductive OFF state (logic zero). The applied voltage at which a memory cell transitions from being sensed as a logic one to being sensed as a logic zero can be termed a threshold voltage of the memory cell. Thus, as an example, when the VDM is higher than the threshold voltage of the memory cell, the memory cell can be sensed as storing a logic one and when the VDM is lower than the threshold voltage of the memory cell, the memory cell can be sensed as storing a logic zero. For an initial read, the VDM is set to one (VDM1). For consequent tries, the VDM can be increased by 1. For example, on the second retry, the VDM can be set to two (VDM2).

At operation 345, the flow diagram 333 can include a request as to whether the error is recoverable. A codeword can contain an unreliable and/or uncorrectable error correction code (UECC). In this embodiment, a UECC codeword occurs when for the MUs that cannot be read in the first read operation using the VDM from operation 344. That is, the unrecovered codewords after the first read using VDM1 can be referred to as UECC codewords.

At operation 346, the flow diagram 333 can include performing a RAID recovery operation. The RAID recovery operation is executed if there are UECC codewords that cannot be read in the initial read operation. Examples of read recovery operations that can be facilitated by an error read flow component can include RAID recovery to correct any errors within the MU. If the data cannot be read using the VDM, a RAID recovery operation can be performed on the MU.

At operation 347, the flow diagram 333 can include a read using a VDM. The RAID recovery operation can be followed by a read with the same VDM from operation 344. The read can be executed to determine how many MUs were recovered during the RAID recovery operation.

At operation 341, the flow diagram 333 can include requesting if the errors within the codewords were recovered. If the codewords were successfully recovered, we move on to operation 348. If there are still errors within the codewords, the process is restarted as indicated in operation 349.

At operation 348, the flow diagram 333 can include a MU that is successfully recovered. A success rate of each level is ascertained by subtracting the number of MUs successfully incremented on a counter at a current level minus the number of MUs successfully incremented on a counter at the next stage. A counter can be incremented for each MU that is successfully recovered during the RAID recovery operation.

At operation 349, the flow diagram 333 can include a retry. If the RAID recovery operation is unable to recover data within the MU, the cycle is restarted from operation 343. The retry is started by executed a second read using the same VDM. On the second retry, the VDM is increased by one. The second VDM can be tried twice before increasing by one. That is, the VDM used to read the codewords from a memory device can be incremented such that subsequent stages of read recovery are performed using a high level discrete read voltage or a high level threshold voltage. A MU not recovering after a fourth retry is an indication that there may be a bug within the data and a debug operation can be executed. That is, after the fifth RAID recovery operation, a debug operation can be executed for unsuccessful read data recovery.

Figure 4:
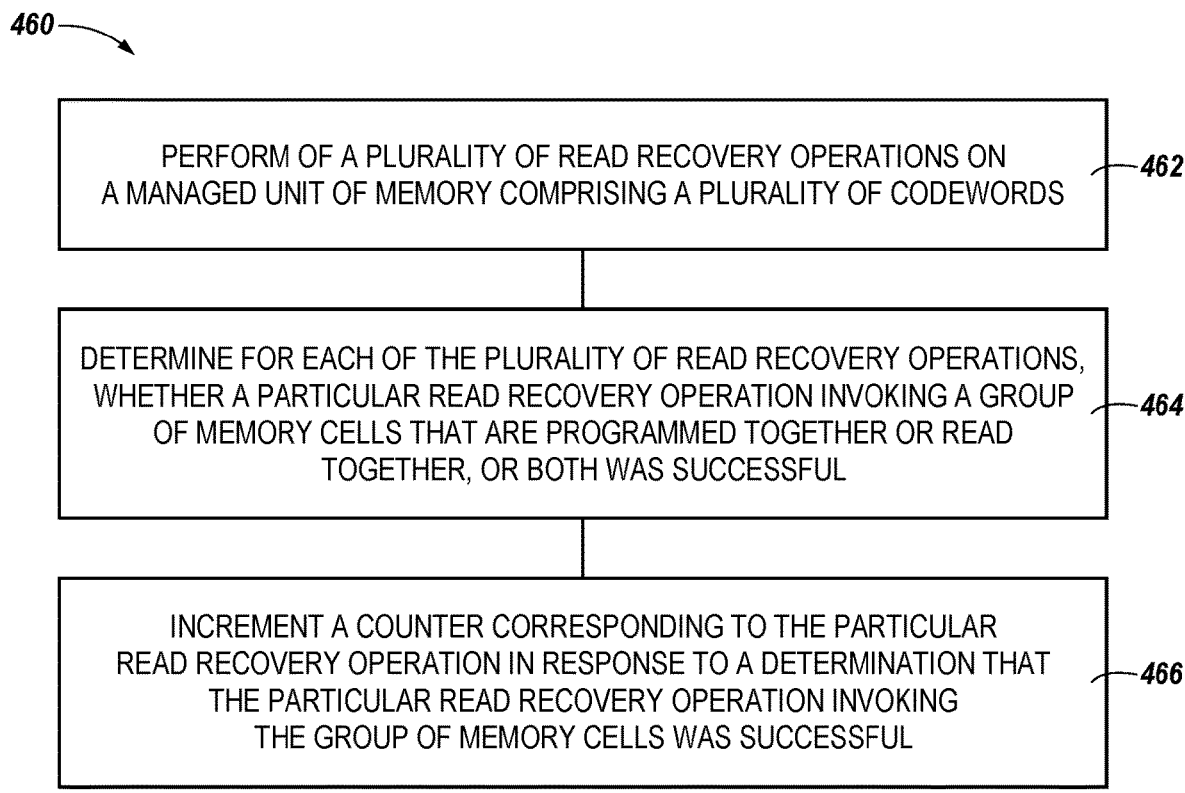
FIG. 4 is a flow diagram of an example method corresponding to an error read flow component in accordance with some embodiments of the present disclosure.

FIG. 4 is a flow diagram of an example method 460 corresponding to an error read flow component in accordance with some embodiments of the present disclosure. The method 460 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 460 is performed by the error read flow component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 462, the method 460 includes performing one or more read recovery operations on a managed unit of memory comprising one or more codewords. An error read flow component can perform data recovery operations on data (e.g., codewords) that contain bit errors, such as bit flip errors, uncorrectable errors, etc. to recover data that can be otherwise unrecoverable in some approaches. In some embodiments, the data can be part of a managed unit (MU) provided to the error read flow component on which read recovery operations will be performed. The error read flow component can determine whether the read recovery operation was performed successfully and can specifically identify at what stage in the recovery the correction is performed and how many errors were corrected at each stage in the process.

At operation 444, the method 460 includes determining for each of the read recovery operations, whether a particular read recovery operation invoking the managed unit was successful. The data within a MU can be read using different discrete read voltages (e.g., VDM retry recovery). The VDM can be applied across the terminals of a memory cell when sensing the state of a memory cell. The state of the memory cell can be sensed based on the reaction of the memory cell to the applied discrete read voltage. For example, the memory cell can either go into a conductive ON state (logic one) or remain in a weakly conductive OFF state (logic zero). The applied voltage at which a memory cell transitions from being sensed as a logic one to being sensed as a logic zero can be termed a threshold voltage of the memory cell. Thus, as an example, when the VDM is higher than the threshold voltage of the memory cell, the memory cell can be sensed as storing a logic one and when the VDM is lower than the threshold voltage of the memory cell, the memory cell can be sensed as storing a logic zero.

In some embodiments, the error read flow component can execute ten (10) read recovery stages which can includes an initial read operation, five (5) redundant array of independent disk (RAID) recovery operations, and four (4) intervening read operations using VDM. In such examples, a MU can be attempted to be recovered through these stages. A success rate of each level can be ascertained by subtracting the number of MUs successfully incremented on a counter at a current level minus the number of MUs successfully incremented on a counter at the next stage.

In some embodiments, a first read operation can be executed to read the data within the MUs using a first VDM (VDM1). A first RAID recovery operation can be executed to recover MUs that were not read during the first read operation. A second read operation can be executed using VDM1, followed by a second RAID recovery operation. A third read operation is executed using a discrete read voltage (VDM2) greater than a discrete read voltage (VDM1) used to initially read the MUs. A third RAID recovery operation is attempted followed by a fourth read operation reusing VDM2 followed by a fourth RAID recovery operation. A fifth read operation is executed using a greater discrete read voltage (VDM3). The fifth read operation is followed by a fifth RAID recovery operation.

At operation 446, the method 460 includes incrementing a counter corresponding to the particular read recovery operation in response to a determination that the particular read recovery operation invoking the managed unit was successful. A counter can be incremented at each stage based on the number of MUs that were successfully recovered.

In some embodiments, the error read flow component can be configured to determine that a quantity of codewords contains an uncorrectable error after the fifth RAID recovery operation. The quantity of codewords can contain an uncorrectable error after a fifth (or greater) RAID recovery operation is deemed lost. A MU not recovering after the fifth RAID recovery operation can be an indication that there may be a bug within the data and a debug operation could be executed.

Figure 5:
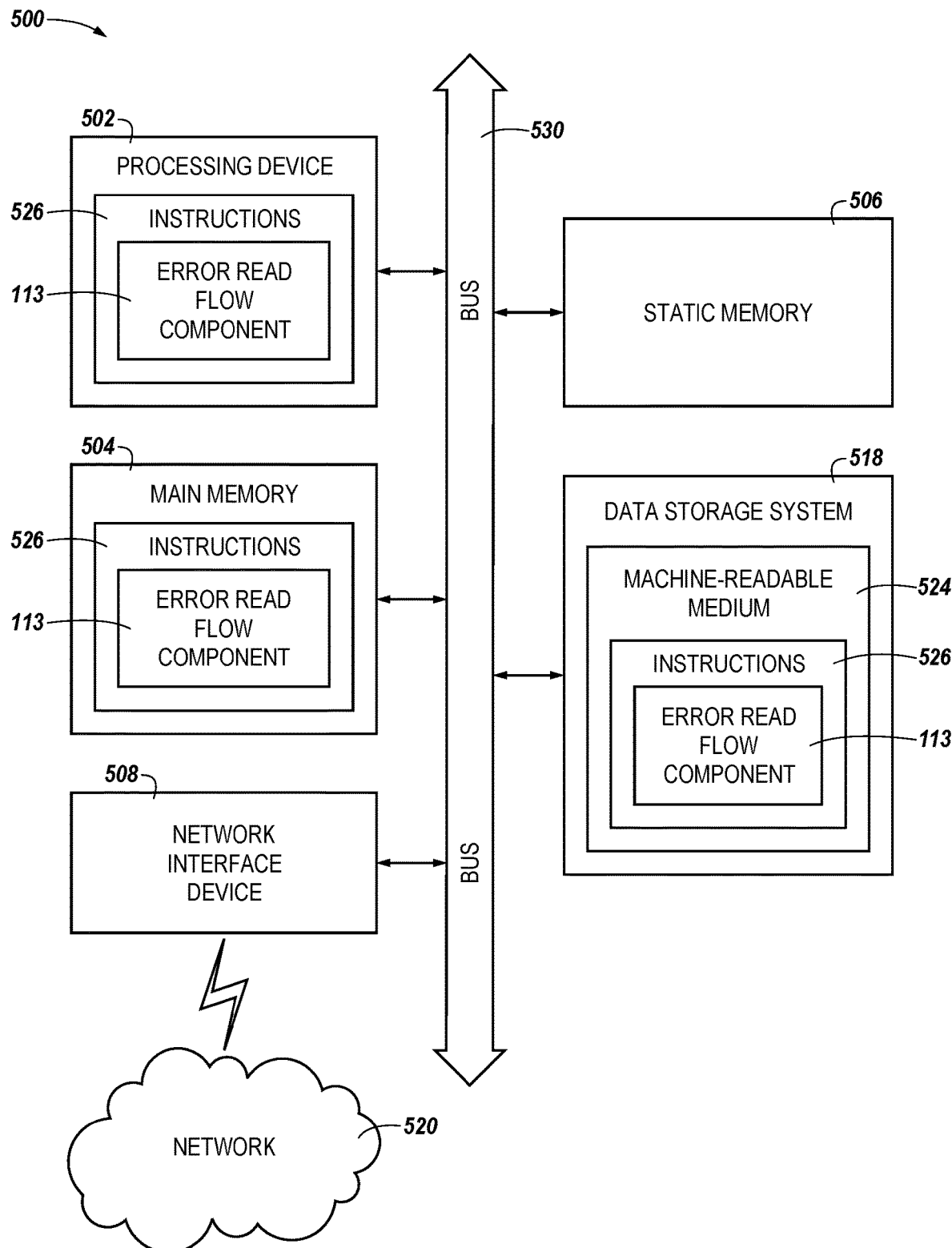
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read error read flow component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and stages discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to error read flow component (e.g., the error read flow component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. An apparatus, comprising:
an error read flow component resident on a memory sub-system and configured to:
cause performance of a plurality of read recovery operations on a group of memory cells that are programmed or read together, or both;
determine whether a particular read recovery operation invoking the group of memory cells was successful;
cause a counter corresponding to each of the plurality of read recovery operations to be incremented in response to a determination that the particular read recovery operation invoking the group of memory cells was successful; and performing a redundant array of independent disk (RAID) recovery operation is performed on the group of memory cells after determining the particular read recovery operation invoking a managed unit was unsuccessful.

2. The apparatus of claim 1, wherein a discrete read voltage is applied across terminals of a memory cell to perform read recovery operations.

3. The apparatus of claim 1, wherein a discrete read voltage is applied across terminals of a memory cell after the RAID recovery operation.

4. The apparatus of claim 1, wherein a discrete read voltage is applied across terminals of a memory cell after the RAID recovery operation two times prior to commencing a read recovery operation using a different discrete read voltage.

5. The apparatus of claim 1, wherein the error read flow component differentiates the success of a counter corresponding to the particular read recovery operation from the counter corresponding to the plurality of read recovery operations.

6. A system, comprising:
a memory sub-system;
a processing device within the memory sub-system, wherein the processing device is configured to perform one or more memory operations comprising:
initiating performance of a plurality of read recovery operations on a group of memory cells comprising a plurality of codewords;
determining, for each of the plurality of read recovery operations, whether a particular read recovery operation was successful;
performing a redundant array of independent disk (RAID) recovery operation for each unsuccessful read recovery operation; and
causing a counter corresponding to the particular read recovery operation to be incremented in response to a determination that the particular read recovery operation invoking the group of memory cells was successful.

7. The system of claim 6, wherein the group of memory cells comprises two redundant array of independent disk (RAID) recovery stripes.

8. The system of claim 6, wherein each group of memory cells comprises approximately 160 bytes or 32 codewords, or both.

9. The system of claim 6, wherein a discrete read voltage (VDM) is applied across terminals of a memory cell to perform read recovery operations.

10. The system of claim 9, wherein the plurality of read recovery operations comprise:
a read recovery process performed by application of the VDM;
the RAID recovery operation for the group of memory cells is performed responsive to the read recovery process being unsuccessful; and
the VDM is reapplied applied across the terminals of the memory cell after the RAID recovery operation.

11. The system of claim 9, wherein the plurality of read recovery operations include three or more operations, and wherein at least two of the three or more operations comprise a plurality of read operations performed by application of the VDM.

12. The system of claim 6, wherein the plurality of read recovery operations include three or more operations, and wherein at least two of the three or more operations comprise RAID recovery operations.

13. The system of claim 6, wherein the plurality of read recovery operations include three or more operations, and wherein at least two of the three or more operations are performed by application of a discrete read voltage (VDM) to terminals of a memory cell.

14. A method, comprising:
performing a plurality of read recovery operations on a managed unit of memory comprising a plurality of;
determining for each of the plurality of read recovery operations, whether a particular read recovery operation invoking a group of memory cells that are programmed together or read together, or both was successful; and
incrementing a first counter corresponding to the particular read recovery operation in response to a determination that the particular read recovery operation invoking the group of memory cells was successful; and
calculating a quantity of groups of memory cells corrected in the particular read recovery operation by subtracting a number written to a second counter from a number written to the first counter.

15. The method of claim 14, wherein the plurality of read recovery operations include:
performing a first read operation using a first discrete read voltage (VDM1);
performing a first redundant array of independent disk (RAID) recovery operation followed by application of the VDM1 to the group of memory cells subsequent to performance of the first read operation using the VDM1;
performing a second read operation using the VDM1 subsequent to performance of the first RAID recovery operation followed by application of the VDM1 to the group of memory cells;
performing a second RAID recovery operation followed by application of the VDM1 subsequent to performance of the second read operation using the VDM1;
performing a third read operation using a second discrete read voltage (VDM2) subsequent to performance of the second RAID recovery operation following by application of the VDM1 to the group of memory cells;
performing a third RAID recovery operation followed by application of the VDM2 subsequent to performance of the third read operation using the VDM2;
performing a fourth read operation using the VMD2 subsequent to performance of the third RAID recovery operation using the VDM2;
performing a fourth RAID recovery operation followed by application of the VDM2 subsequent to performance of the fourth read operation using the VDM2;
performing a fifth read operation using a third discrete read voltage (VDM3) subsequent to performance of the fourth RAID recovery operation using the VDM2; and
performing a fifth RAID recovery operation followed by application of the VDM3 subsequent to performance of the fifth read operation using the VDM3.

16. The method of claim 15, further comprising determining the quantity of successful read operation by subtracting a difference between a value corresponding to the counter at a particular stage and a value of the counter at a next stage.

17. The method of claim 14, further comprising performing a debugging operation based on information from the counter.

18. An apparatus, comprising:
an error read flow component resident on a memory sub-system and configured to:
cause performance of a plurality of read recovery operations on a group of memory cells that are programmed or read together, or both;
determine whether a particular read recovery operation invoking the group of memory cells was successful; and
cause a counter corresponding to each of the plurality of read recovery operations to be incremented in response to a determination that the particular read recovery operation invoking the group of memory cells was successful wherein the error read flow component differentiates the success of a counter corresponding to the particular read recovery operation from the counter corresponding to the plurality of read recovery operations.

19. A method, comprising:
performing a plurality of read recovery operations on a managed unit of memory comprising a plurality of codewords;
determining for each of the plurality of read recovery operations, whether a particular read recovery operation invoking a group of memory cells that are programmed together or read together, or both was successful; and
incrementing a counter corresponding to the particular read recovery operation in response to a determination that the particular read recovery operation invoking the group of memory cells was successful; and
performing a debugging operation based on information from the counter.

* * * * *